(12) United States Patent
Takagi

(10) Patent No.: US 6,169,019 B1
(45) Date of Patent: Jan. 2, 2001

(54) SEMICONDUCTOR APPARATUS AND MANUFACTURING METHOD THEREFOR

(75) Inventor: Mariko Takagi, Kawasaki (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/078,493

(22) Filed: May 14, 1998

(30) Foreign Application Priority Data

May 14, 1997 (JP) .................................................. 9-124108

(51) Int. Cl.⁷ .................................................. H01L 21/44
(52) U.S. Cl. .................... 438/597; 438/634; 438/635; 438/648; 438/656; 438/682; 438/685; 257/758; 257/764; 257/768
(58) Field of Search .................................. 438/597, 634, 438/635; 257/768, 758, 764

(56) References Cited

U.S. PATENT DOCUMENTS

| | | | |
|---|---|---|---|
| 5,539,256 | * 7/1996 | Mikagi | 257/763 |
| 5,770,520 | * 6/1998 | Zhao et al. | 438/653 |
| 5,801,098 | * 9/1998 | Fiordalice et al. | 438/653 |
| 5,880,018 | * 3/1999 | Boech et al. | 438/619 |
| 5,913,147 | * 6/1999 | Dubin et al. | 438/687 |

* cited by examiner

Primary Examiner—John F. Niebling
Assistant Examiner—Lynne A. Gurley
(74) Attorney, Agent, or Firm—Foley & Lardner

(57) ABSTRACT

In a method of manufacturing a semiconductor device, a titanium silicide layer is formed on a region of a diffusion layer formed in a semiconductor substrate. A silicon nitride film functioning as an etching stopper is formed on the semiconductor substrate. The silicon nitride film covers the layer. An interlayered insulating film is formed on the silicon nitride film. A barrier metal of Tin/Ti is formed in a contact hole, which is formed in the interlayered insulating film. The contact holes is opened toward the diffusion layer. A conductive film comprising a Ti—Si—N based alloy is formed between a metal wiring and the diffusion layer. The conductive film is formed by reacting the silicon nitride film with titanium contained in the titanium silicide layer or the barrier metal. With these manufacturing features, the manufacturing process is not increased and the manufacturing cost can be reduced.

21 Claims, 9 Drawing Sheets

SEMICONDUCTOR APPARATUS AND MANUFACTURING METHOD THEREFOR

BACKGROUND OF THE INVENTION

The present invention relates to a semiconductor apparatus having a self-alignment contact structure and a manufacturing method therefor.

The performance of an integrated circuit apparatus can be improved and a degree of integration can be raised by reducing the size of each of devices for forming the integrated circuit.

In a case of a MOS transistor, the degree of integration can be raised by reducing the width of a gate electrode, a contact diameter of a contact hole with respect to a source/drain diffusion layer and a width (hereinafter called a "aligning margin") between the contact hole and a device isolation film if an assumption is made that the mask is not displaced.

The aligning margin d between a contact hole 10 and a device isolation film 11 exerts a considerable influence on an attempt to raise the degree of integration, as shown in FIG. 19. On the other hand,. the aligning margin d does not exert a considerable influence on the performance of the transistor. That is, the aligning margin d does not deteriorate the performance of the transistor. Therefore, reduction of the aligning margin d is an effective means to improve the degree of integration.

However, if the displacement in alignment between the pattern of the contact hole of the reticle and the pattern of the transistor of the integrated circuit apparatus is greater than the aligning margin d when lithography of a photoresist is performed to determine the position of the contact hole 10 with respect to a source/drain diffusion layer 12, there arises a problem in that leakage currents are enlarged.

The foregoing problem will now be described.

If the displacement in alignment is greater than the aligning margin d, a portion of the contact hole 10 overlaps the device isolation film 11, as shown in FIG. 20.

Both of the device isolation film 11 and the interlayered insulating film of a usual integrated circuit apparatus are made of oxide films (SiO$_2$) or the like because of an excellent insulating characteristic and a low dielectric constant of the oxide film.

That is, the device isolation film 11 and the interlayered insulating film are made of the same material. Therefore, a low etching selection ratio is realized between the device isolation film 11 and the interlayered insulating film. Thus, when a photoresist pattern mask is used after a lithography process has been performed to etch a interlayered insulating film 14 by a RIE method or the like, a portion of the device isolation film 11 (a LOCOS film or a STI (Shallow Trench Isolation) film) overlapping the contact hole 10 is undesirably etched.

Above-mentioned overetching is caused from the structure that the device isolation film 11 and the interlayered insulating film 14 are made of materials of the same system (that is, materials having a low etching selection ratio).

If the device isolation film 11 is etched, the distance from a pn junction surface between the silicon substrate 16 and the source/drain diffusion layer 12 to the interface between the metal layer 15 and the source/drain diffusion layer 12 in the contact hole 10 is undesirably shortened, as shown in FIG. 21. In the worst case, the metal layer 15 and the silicon substrate 16 are short-circuited, as shown in FIG. 22. In this case, electric charges are introduced from the metal layer 15 into the silicon substrate 16, causing leakage currents to easily flow.

A method which is capable of preventing the above-mentioned problem has been known with which a film having a large etching selection ratio with respect to the interlayered insulating film and the device isolation film (a silicon oxide film or the like) serving as an etching stopper is formed between the interlayered insulating film and the device isolation film and between the source-drain diffusion layer and the interlayered insulating film.

The above-mentioned method, as shown in FIG. 23, has an initial step of forming a MOS transistor having a source/drain diffusion layer 12 and a gate electrode 13 in a device region thereof surrounded by a device isolation film 11 (a silicon oxide film or the like) on a silicon substrate 16.

Note that the MOS transistor has a structure that a gate oxide film 17 is disposed immediately below the gate electrode 13. Moreover, silicon nitride films 18 and 19 are formed on the upper surface and side surfaces of the gate electrode 13.

At this time, the surface of the source/drain diffusion layer 12 is exposed to the outside.

Then, an LPCVD method is employed to form a silicon nitride film 20 serving as an etching stopper is formed on the overall surface of the silicon substrate 16. Then, the LPCVD method is again employed to form a interlayered insulating film (a silicon oxide film or the like) 14 on the silicon nitride film 20.

Then, a RIE method is employed to etch the interlayered insulating film 14 as shown in FIG. 24 so that a contact hole 10 is provided for the interlayered insulating film 14. At this time, the silicon nitride film 20 has a high etching selection ratio with respect to the silicon oxide films for forming the device isolation film 11 and the interlayered insulating film 14, the etching selection ratio being a ratio for the RIE process. Therefore, the silicon nitride film 20 is able to serve as the stopper. Thus, etching is stopped at a position on the upper surface of the silicon nitride film 20. Therefore, the device isolation film 11 is not undesirably etched.

Then, only a portion of the silicon nitride film 20 existing in the bottom surface of the contact hole 10 is etched by, for example, an RIE method, as shown in FIG. 25. As a result, the source/drain diffusion layer 12 is, in the bottom surface of the contact hole 10, exposed to the outside.

Even if displacement in alignment of the mask causes the contact hole 10 and the device isolation film 11 to overlap as shown in FIG. 25, the silicon nitride film 20 is able to serve as a stopper because the silicon nitride film 20 has a high etching selection ratio in the RIE method with respect to the device isolation film (silicon oxide film or the like) 11. Therefore, etching is stopped at a position on the surface of the device isolation film 11. Thus, the device isolation film 11 is not undesirably etched.

As described above, the above-mentioned conventional method arranged to form the contact hole 10 for the source/drain diffusion layer 12 is structured in such a manner that the silicon nitride film 20 serving as the etching stopper is formed on the source/drain diffusion layer 12 and the device isolation film 11. Therefore, the device isolation film 11 is not etched. Thus, enlargement of the leakage current can be prevented.

However, the above-mentioned method must perform the etching process two times when the contact hole is formed because the interlayered insulating film 14 and the silicon nitride film 20 must be etched individually.

Therefore, the above-mentioned method has a problem in that the manufacturing step increases and thus the manufacturing cost cannot be reduced as compared with another method arranged in such a manner that the silicon nitride film 20 serving as the etching stopper is not formed.

Another problem arises in that the structure in which the etching process is performed two times causes a stepped portion X to easily be generated in the interface between the interlayered insulating film 14 and the silicon nitride film 20, as shown in FIG. 25. Since the stepped portion X inhibits easy deposition of a material for the metal layer 15 when the metal layer 15 is formed in the contact hole 10, there arises a problem in that the stepped portion X sometimes disconnects the metal layer 15.

Another problem arises in that the not so large etching selection ratio between the silicon nitride film 20 and the substrate (silicon or silicide in the source-drain diffusion layer) 16 causes also the substrate 16 to be etched when the silicon nitride film 20 is etched and thus a recess Y is formed in the substrate 16, as shown in FIG. 25.

Precise MOS transistors developed in recent years has a structure that the source/drain diffusion layer 12 has a very small depth in order to prevent a short channel effect. In this case, enlargement of the recess Y causes the contact hole 10 to undesirably penetrate the source/drain diffusion layer 12. In this case, the leakage current and contact resistance are enlarged excessively.

A method is known which is capable of solving the above-mentioned problem in such a manner that impurities are again introduced into the source/drain diffusion layer 12 after the contact hole 10 has been formed so as to enlarge the depth of the source/drain diffusion layer 12 in only the contact portion between the source/drain diffusion layer 12 and the metal layer 15.

However, if the above-mentioned method is employed to manufacture an integrated circuit apparatus having a CMOS structure, the lithography process and ion injection process must be performed for each of the p-channel MOS transistor and the N-channel MOS transistor. What is worse, one annealing process must be performed to activate the impurities introduced into the substrate.

That is, two lithography processes, two ion injection processes and one annealing process are increased, causing the cost to be enlarged.

Since the annealing process is performed at temperatures not lower than 900° C., the depth of the source/drain diffusion layer 12 which has been formed to have a shallow depth is enlarged undesirably. In this case, prevention of the short channel effect attempted to be realized by reducing the depth cannot sometimes be achieved.

As described above, the conventional method has a problem in that the displacement in alignment of the mask for use in the lithography process causes the device isolation film to undesirably be etched when the contact hole is formed in the source/drain diffusion layer and thus the leakage current is enlarged excessively. Moreover, any effective means which is able to overcome the above-mentioned problem has not been realized.

BRIEF SUMMARY OF THE INVENTION

In view of the foregoing, an object of the present invention is to provide a method of manufacturing a semiconductor apparatus which is capable of stopping etching at a required position even if displacement in alignment of a mask for lithography takes place when a contact hole or a via hole is formed, and which is free from increase in the number of manufacturing processes and a semiconductor apparatus which is manufactured by the method and with which the density of integration and manufacturing yield can be raised and the reliability can be improved.

To achieve the above-mentioned object, a semiconductor apparatus according to the present invention comprises a base layer; a first conductive layer formed on the base layer; an interlayered insulating film formed on the base layer, the interlayered insulating film covering the first conductive layer and having a contact hole opening toward the first conductive layer; an etching stopper insulating film formed between the base layer and the interlayered insulating film, the etching stopper insulating film covering the first conductive layer; a second conductive layer formed in the contact hole formed in the interlayered insulating film; and an alloyed layer formed between the first conductive layer and the second conductive layer and having a composition containing atoms for forming the etching stopper insulating film and metal atoms of at least one of the first conductive layer and the second conductive layer.

In the semiconductor apparatus, the etching stopper insulating film may be made of a material having a sufficiently high selection ratio to serve as an etching stopper for the interlayered insulating film and which produces an alloying reaction with metal atoms of at least one of the first conductive layer and the second conductive layer.

In the semiconductor apparatus, the base layer may be comprised of a semiconductor substrate, the first conductive layer may be comprised of a silicide layer formed on a diffusion layer formed in a surface region of the semiconductor substrate, and the alloyed layer may be formed between the silicide layer and the second conductive layer and may have a composition containing atoms for forming the etching stopper insulating film and metal atoms of the silicide layer.

In the semiconductor apparatus, the base layer may be comprised of a semiconductor substrate, the first conductive layer may be comprised of silicide layers formed on source/drain diffusion layers formed in a surface region of the semiconductor substrate and a silicide layer formed on a gate electrode formed on a channel region between the source/drain diffusion layers, and the alloyed layer may be formed between the silicide layers and the second conductive layer and may have a composition containing atoms for forming the etching stopper insulating film and metal atoms of the silicide layers.

In the semiconductor apparatus, the base layer may be comprised of a semiconductor substrate, the first conductive layer may be comprised of a diffusion layer formed in a surface region of the semiconductor substrate, a lower portion of the second conductive layer may be formed of a metal layer including metal having a high melting point, and the alloyed layer may be formed between the diffusion layer of the first conductive layer and the lower portion of the second conductive layer and may have a composition containing atoms for forming the etching stopper insulating film and metal atoms in the metal layer of the second conductive layer.

In the semiconductor apparatus, the base layer may be comprised of a semiconductor substrate, the first conductive layer may be comprised of source/drain diffusion layers formed in a surface region of the semiconductor substrate and a gate electrode formed on a channel region between the source/drain diffusion layers, a lower portion of the second conductive layer may be formed of a metal layer including metal having a high melting point, and the alloyed layer may be formed between the diffusion layers and the metal layer of the second conductive layer and may have a composition containing atoms for forming the etching stopper insulating film and metal atoms of the high melting point metal of the metal layer of the second conductive layer.

In the semiconductor apparatus, the base layer may be comprised of a semiconductor substrate, the first conductive layer may be comprised of a silicide layer formed on a diffusion layer formed in a surface region of the semiconductor substrate, a lower portion of the second conductive layer may be formed of a metal layer including metal having a high melting point, and the alloyed layer may be formed between the silicide layer of the first conductive layer and the metal layer of the second conductive layer and may have a composition containing atoms for forming the etching stopper insulating film, metal atoms in the silicide layer of the first conductive layer and metal atoms of the high melting point metal of the metal layer of the second conductive layer.

In the semiconductor apparatus, the base layer may be comprised of a semiconductor substrate, the first conductive layer may be comprised of silicide layers formed on source/drain diffusion layers formed in a surface region of the semiconductor substrate and a silicide layer formed on a gate electrode formed on a channel region between the source/drain diffusion layers, a lower portion of the second conductive layer may be formed of a metal layer including metal having a high melting point, and the alloyed layer may be formed between the silicide layers of the first conductive layer and the metal layer of the second conductive layer and may have a composition containing atoms for forming the etching stopper insulating film, metal atoms of the silicide layers of the first conductive layer and metal atoms of the high melting point metal of the metal layer of the second conductive layer.

In the semiconductor apparatus, the base layer may be comprised of an underlayered insulating film formed on a semiconductor substrate, the first conductive layer may be formed on the underlayered insulating film, an upper portion of the first conductive layer may be comprised of a metal layer containing metal having a high melting point, and the alloyed layer may be formed between the metal layer and the second conductive layer and may have a composition containing atoms for forming the etching stopper insulating film and metal atoms of the high melting point metal of the metal layer of the first conductive layer.

In the semiconductor apparatus, the base layer may be comprised of an underlayered insulating film formed on a semiconductor substrate, the first conductive layer may be formed on the underlayered insulating film, a lower portion of the second conductive layer may be formed of a metal layer including metal having a high melting point, and the alloyed layer may be formed between the first conductive layer and the metal layer of the second conductive layer and may have a composition containing atoms for forming the etching stopper insulating film and metal atoms of the high melting point metal of the metal layer of the second conductive layer.

In the semiconductor apparatus, the base layer may be comprised of an underlayered insulating film formed on a semiconductor substrate, the first conductive layer may be formed on the underlayered insulating film, an upper portion of the first conductive layer may be formed of a first metal layer including metal having a high melting point, a lower portion of the second conductive layer may be formed of a second metal layer including metal having a high melting point, and the alloyed layer may be formed between the first metal layer and the second metal layer and may have a composition containing atoms for forming the etching stopper insulating film, metal atoms of the high melting point metal of the first metal layer of the first conductive layer, and metal atoms of the high melting point metal of the second metal layer of the second conductive layer.

A method of manufacturing a semiconductor apparatus according to the present invention comprises the steps of forming a first conductive layer formed on a base layer; forming an etching stopper insulating film on the base layer, the etching stopper insulating film covering the first conductive layer; forming an interlayered insulating film on the etching stopper insulating film, the interlayered insulating film covering the first conductive layer; forming a contact hole in the interlayered insulating film, the contact hole opening toward the first conductive layer; forming a second conductive layer in the opening formed in the interlayered insulating film; and performing annealing to react the etching stopper insulating film with at least one of the first conductive layer and the second conductive layer so that the etching stopper insulating film is alloyed with at least one of the first conductive layer and the second conductive layer.

In the method of manufacturing a semiconductor apparatus, the first conductive layer forming step may include a step of forming a silicide layer, as the first conductive layer, on a diffusion layer formed in a surface region of the semiconductor substrate, and the annealing step may include an annealing step to react the etching stopper insulating film with the silicide layer of the first conductive layer so that the etching stopper insulating film is alloyed with the silicide layer of the first conductive layer.

In the method of manufacturing a semiconductor apparatus, the first conductive layer forming step may include a step of forming silicide layers, as the first conductive layer, on source/drain diffusion layers formed in a surface region of the semiconductor substrate and a silicide layer on a gate electrode formed on a channel region between the source/drain diffusion layers, and the annealing step may include an annealing step to react the etching stopper insulating film with the silicide layers so that the etching stopper insulating film is alloyed with the silicide layers.

In the method of manufacturing a semiconductor apparatus, the first conductive layer forming step may include a step of forming a diffusion layer, as the first conductive layer, in a surface region of the semiconductor substrate, the second conductive layer forming step may include a step of forming a metal layer, as the second conductive layer, containing metal having a high melting point in the contact hole formed in the interlayered insulating film, and the annealing step may include an annealing step to react the etching stopper insulating film with the high melting point metal of the second conductive layer so that the etching stopper insulating film is alloyed with the high melting point metal of the second conductive layer.

In the method of manufacturing a semiconductor apparatus, the first conductive layer forming step may include a step of forming, source/drain diffusion layers, as the first conductive layer, in a surface region of the semiconductor substrate and a gate electrode on a channel region between the source/drain diffusion layers, the second conductive layer forming step may include a step of forming metal layers, as the second conductive layer, containing metal having a high melting point in the contact holes formed in the interlayered insulating film, and the annealing step may include an annealing step to react the etching stopper insulating film with the high melting point metal layers so that the etching stopper insulating film is alloyed with the high melting point metal layers.

In the method of manufacturing a semiconductor apparatus, the first conductive layer forming step may include a step of forming a silicide layer, as the first conductive layer, on a diffusion layer formed in a surface region of the semiconductor substrate, the second conductive layer forming step may include a step of forming a metal layer, as the second conductive layer, containing metal having a high melting point in the contact hole formed in the interlayered insulating film, and the annealing step may include an annealing step to react the etching stopper insulating film with the silicide layer of the first conductive layer and the high melting point metal layer of the second conductive layer so that the etching stopper insulating film is alloyed with the silicide layer of the first conductive layer and the high melting point metal layer of the second conductive layer.

In the method of manufacturing a semiconductor apparatus, the first conductive layer forming step may include a step of forming silicide layers, as the first conductive layer, on source/drain diffusion layers formed in a surface region of the semiconductor substrate and a silicide layer formed on a gate electrode formed on a channel region between the source/drain diffusion layers, the second conductive layer forming step may include a step of forming metal layers, as the second conductive layer, containing metal having a high melting point in the contact holes formed in the interlayered insulating film, and the annealing step may include an annealing step to react the etching stopper insulating film with the silicide layers and the high melting point metal layers so that the etching stopper insulating film is alloyed with the silicide layers and the high melting point metal layers.

In the method of manufacturing a semiconductor apparatus, the first conductive layer forming step may include a step of forming a metal layer containing metal having a high melting point, as the first conductive layer, on an underlayered insulating film formed on a semiconductor substrate, and the annealing step may include an annealing step to react the etching stopper insulating film with the high melting point metal layer of the first conductive layer so that the etching stopper insulating film is alloyed with the high melting point metal layer of the first conductive layer.

In the method of manufacturing a semiconductor apparatus, first conductive layer forming step may include a step of forming a first metal layer, as the first conductive layer, on an underlayered insulating film formed on a semiconductor substrate, the second conductive layer forming step may include a step of forming a second metal layer, as the second conductive layer, containing metal having a high melting point in the contact hole formed in the interlayered insulating film, and the annealing step may include an annealing step to react the etching stopper insulating film with the second metal layer of the high melting point metal so that the etching stopper insulating film is alloyed with the second metal layer of high melting point metal.

In the method of manufacturing a semiconductor apparatus, the first conductive layer forming step may include a step of forming a first metal layer containing metal having a high melting point, as the first conductive layer, on an underlayered insulating film formed on a semiconductor substrate, the second conductive layer forming step may include a step of forming a second metal layer, as the second conductive layer, containing metal having a high melting point in the contact hole formed in the interlayered insulating film, and the annealing step may include an annealing step to react the etching stopper insulating film with first metal layer of the high melting point metal and the second metal layer of the high melting point metal so that the etching stopper insulating film is alloyed with first metal layer of the high melting point metal and the second metal layer of the high melting point metal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1A:
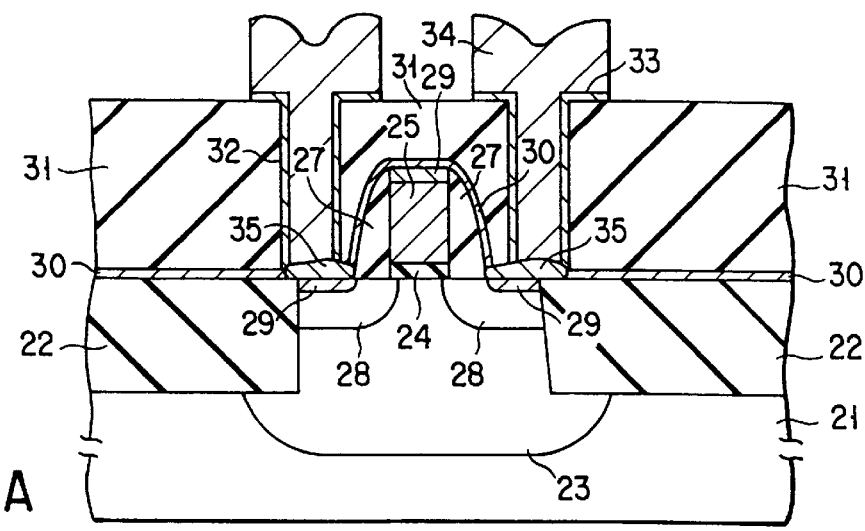
FIGS. 1A and 1B are diagrams showing different cross sections of a semiconductor apparatus according to a first embodiment of the present invention.

Referring to the drawings, a semiconductor apparatus and a method of manufacturing the same according to the present invention will now be described.

Figure 1B:
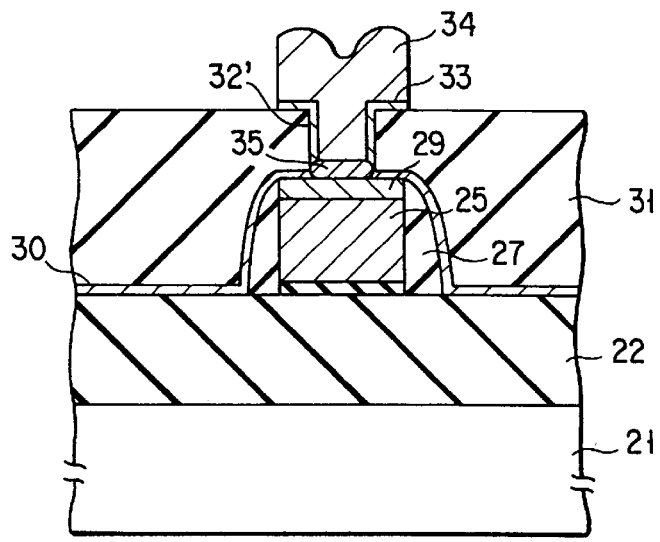

FIG. 1 shows a semiconductor apparatus according to a first embodiment of the present invention.

This embodiment relates to the structure of a contact hole for a source/drain diffusion layer and a gate electrode of a MOS transistor.

For example, a device isolation film 22 is formed in a surface region of an N-type silicon substrate 21. The device isolation film 22 has a STI (Shallow Trench Isolation) structure. Therefore, the surface of the silicon substrate 21 and that of the device isolation film 22 are substantially flushed with each other. As an alternative to the STI structure, the device isolation film 22 may have, for example, a LOCOS structure.

A portion of the silicon substrate 21 surrounded by the device isolation film 22 is formed into a P-type well region 23. The depth of the well region 23 is made to be larger than the depth (the thickness) of the device isolation film 22. When the silicon substrate 21 has a P-type structure, the well region 23 has an N-type structure.

A source/drain diffusion layer 28 is formed in a surface region of the well region 23. A portion 29 of the surface region of the source/drain diffusion layer 28 is formed into a silicide layer (for example, a titanium silicide layer). Also an upper portion of the gate electrode is formed into the titanium silicide layer 29.

The semiconductor apparatus shown in FIG. 1 has a structure that the portion 29 of the surface region of the source/drain diffusion layer 28 is formed into the silicide layer (the silicide structure). Moreover, also the titanium silicide layer 29 (the silicide structure) is formed on the gate electrode 25. Therefore, both of the contact resistance and the gate circuit resistance can be reduced.

The gate electrode 25 is formed on a gate oxide film (for example, a silicon oxide film) 24 on a channel region between the source/drain diffusion layer 28. The gate electrode 25 is in the form of, for example, a polysilicon film containing impurities. A silicon nitride film 27 is formed on each of side surfaces of the gate electrode 25 adjacent to the source/drain diffusion layer 28.

An insulating film 30 which is an essential portion of the present invention is formed on the upper surface of the semiconductor substrate having the above-mentioned structure. The insulating film 30 must have at least two following characteristics.

That is, the insulating film 30 must have a sufficiently large etching selection ratio with respect to the device isolation film 22 and the interlayered insulating film 31. Moreover, the insulating film 30 must react with silicon, silicide or metal by performing a heating process so as to be changed into a conductive film.

The insulating film having the two characteristics above is exemplified by a silicon nitride (SiN) film if each of the device isolation film 22 and the interlayered insulating film 31 is made of a silicon oxide film ($SiO_2$).

The silicon nitride film, having an insulating characteristic, reacts with, for example, metal, such as titanium nitride (TiN) or titanium (Ti) or titanium silicide ($TiSi_2$) so that the silicon nitride film is converted into $Ti_xSi_yN_z$ (x, y and z each are an arbitrary number).

A interlayered insulating film 31 is formed on the insulating film 30. A contact hole 32 which reaches the source/drain diffusion layer 28 is formed in the interlayered insulating film 31. The contact hole 32 may overlap the device isolation film 22 or no overlap is permitted. Note that the bottom surface of the contact hole 32 does not reach the inside portion of the silicon substrate 21 or the device isolation film 22.

A barrier metal 33 and a metal layer 34 are formed in the contact hole 32. The barrier metal 33 must be metal having a high melting point, a nitride of metal having a high melting point or their laminate structure. For example, the barrier metal 33 may be a laminate of titanium (Ti) and titanium nitride (TiN). That is, a wiring layer having a low portion which is formed into a metal layer containing metal having a high melting point is formed in the contact hole 32. The metal layer 34 may be made of, for example, Al (Aluminum)-Si (Silicon)-Cu (Copper) type material.

A conductive film 35 is formed between the portion (the silicide layer) 29 of the source/drain diffusion layer 28 and the metal layer 34. The conductive film 35 is formed by causing the insulating film 30 to react with the titanium silicide layer 29 and/or the barrier metal 33. Therefore, the composition of the conductive film 35 contains at least atoms for forming the insulating film 30, those for forming the titanium silicide layer 29 and/or those for forming the barrier metal 33.

When the titanium silicide layer 29 is made of titanium silicide, the insulating film 30 is made of silicon nitride, and the barrier metal 33 is in the form of a laminate of titanium and titanium nitride, the conductive film 35 has a composition expressed by $Ti_xSi_yN_z$.

Similarly, a contact hole 32' opposite to the gate electrode 25 is formed in the interlayered insulating film 31 on the device isolation film 22. The contact hole 32' includes barrier metal 33 and a metal layer 34. A conductive film 35 is formed between the gate electrode 25 and the metal layer 34. The conductive film 35 is formed by causing the insulating film 30 to react with the titanium silicide layer 29 and/or the barrier metal 33.

The semiconductor apparatus having the above-mentioned structure incorporates the insulating film 30 at least on the device isolation film 22, the insulating film 30 having a predetermined characteristic. Therefore, the contact hole 32 opposite to the source/drain diffusion layer 28 is not introduced into the silicon substrate 21 or the device isolation film 22. Moreover, the contact hole 32' opposite to the gate electrode 25 does not reach the surface of the silicon substrate 21.

Therefore, generation of a leakage current in the silicon substrate 21 can be prevented. Moreover, the manufacturing yield of the semiconductor devices can be improved. The conductive film 35 is formed between the silicide layer 29 and the metal layer 34. Since the conductive film 35 is formed by making the insulating film 30 to have conductivity, the manufacturing process is not increased. Thus, cost can be reduced.

A method of manufacturing the semiconductor apparatus according to the first embodiment will now be described.

Figure 2:
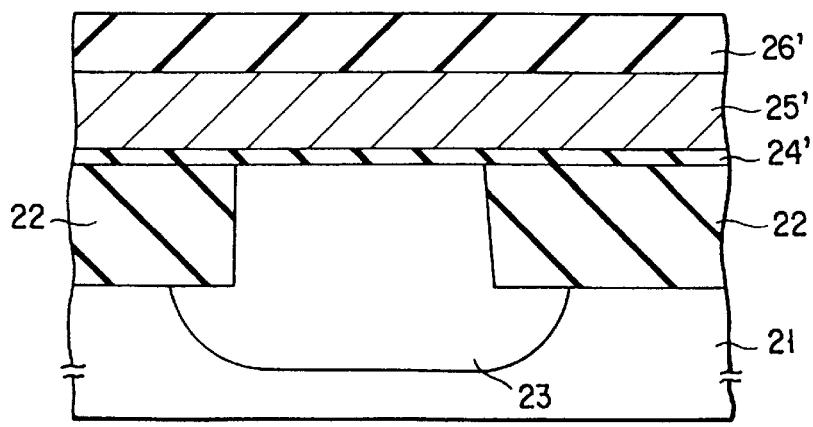
FIG. 2 is a diagram showing the cross section of the structure of the semiconductor apparatus in a process of a method of manufacturing the semiconductor apparatus shown in FIGS. 1A and 1B.

Initially, a groove is formed in the silicon substrate 21, as shown in FIG. 2. Then, the insulating film, such as the silicon oxide film, is formed in the groove so that the device isolation film 22 having the STI structure is formed. Note that the device isolation film may be a field oxide film which can be formed by a LOCOS method.

For example, an ion injection method is employed to introduce P-type impurities, such as boron (B), into a portion (a device region) of the surface region of the silicon substrate 21 surrounded by the device isolation film 22 so that the P-type well region 23 is formed.

Then, for example, a thermal oxidation method is employed so that a silicon oxide film 24' is formed on the surface of the P-type well region 23 of the silicon substrate 21. Moreover, for example, the LPCVD method is employed so that a polysilicon film 25' is formed on the silicon oxide film 24', the gate electrode 25' containing N-type impurities, such as phosphor (P) or arsenic (As) and having a thickness of about 200 nm. Then, for example, the LPCVD method is employed so that a silicon nitride film 26' is formed on the polysilicon film 25'.

Then, the photolithography technique is employed so that a resist pattern (not shown) is formed on the silicon nitride film 26'. The formed resist pattern is used as a mask when the silicon nitride film 26' is patterned so that a pattern 26 (see FIG. 3) of the silicon nitride film is formed. Then, the resist pattern is removed, and then the pattern 26 of the silicon nitride film is used as a mask when the polysilicon film 25' and the silicon oxide film 24' are etched by a RIE method.

Figure 3:
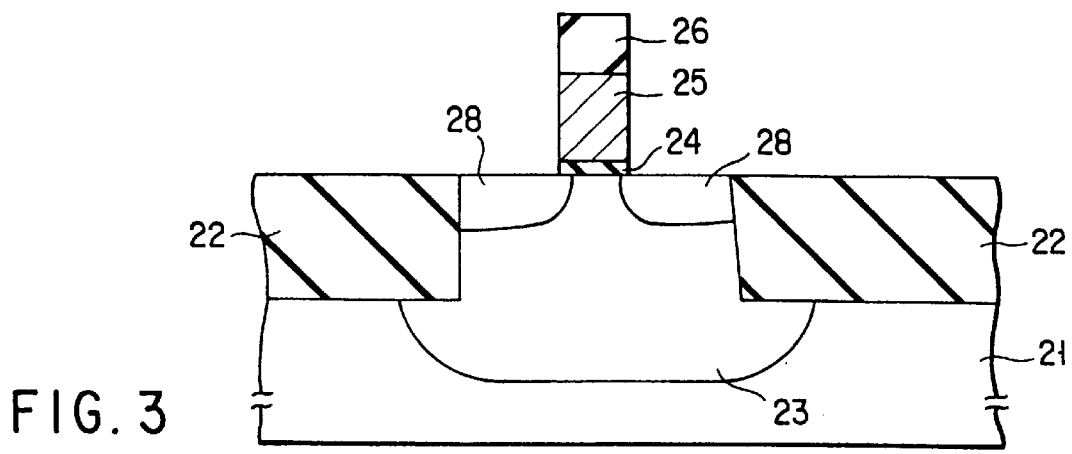
FIG. 3 is a diagram showing the cross section of the structure of the semiconductor apparatus in a process of the method of manufacturing the semiconductor apparatus shown in FIGS. 1A and 1B.

As a result, the gate electrode 25 and the gate insulating film 24 are formed immediately below the pattern 26, as shown in FIG. 3.

The ion injection method is employed when N-type impurities (for example, arsenic) are injected into the well region 23 at a predetermined acceleration by a self-aligning manner in such a manner that the gate electrode 25 is used as a mask. When the well region 23 has the N-type structure, P-type impurities, for example, boron (B), are injected.

Then, the pattern 26 of the silicon nitride film is removed.

The N-type impurities in the well region 23 are activated in a heating process (a process in which heat of annealing or the like is applied). The region, into which the N-type impurities have been injected, is formed into the N-type source/drain diffusion layer 28.

Figure 4:
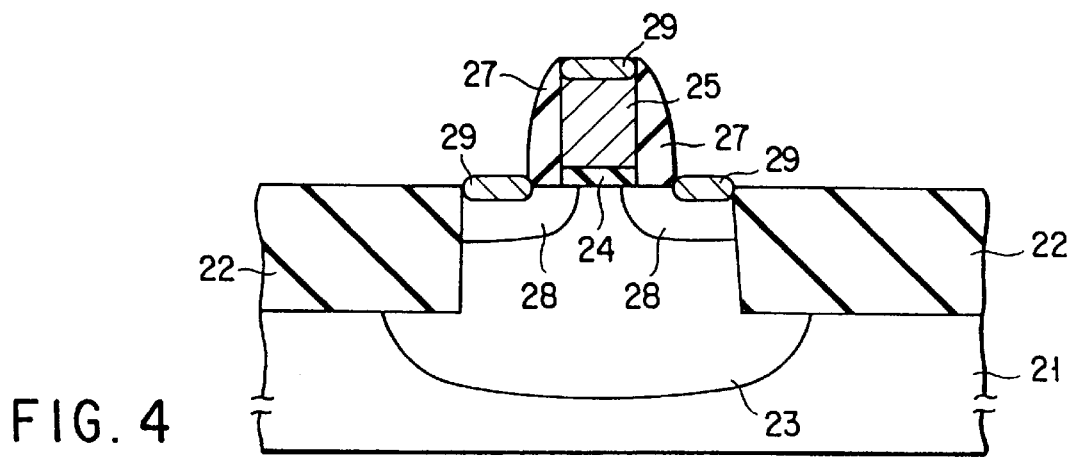
FIG. 4 is a diagram showing the cross section of the structure of the semiconductor apparatus in a process of the method of manufacturing the semiconductor apparatus shown in FIGS. 1A and 1B.

Then, the LPCVD method is employed so that the silicon nitride film is formed on the overall surface of the silicon substrate 21. Then, the RIE method is employed to etch the silicon nitride film. As a result, the silicon nitride film 27 is allowed to remain on the side surfaces (the side surfaces adjacent to the source/drain diffusion layer) of the gate electrode 25, as shown in FIG. 4.

Then, the titanium silicide layer ($TiSi_2$) 29 is simultaneously formed on the surface of the exposed source/drain diffusion layer 28 and the gate electrode 25 (a silicide structure is formed).

Figure 5:
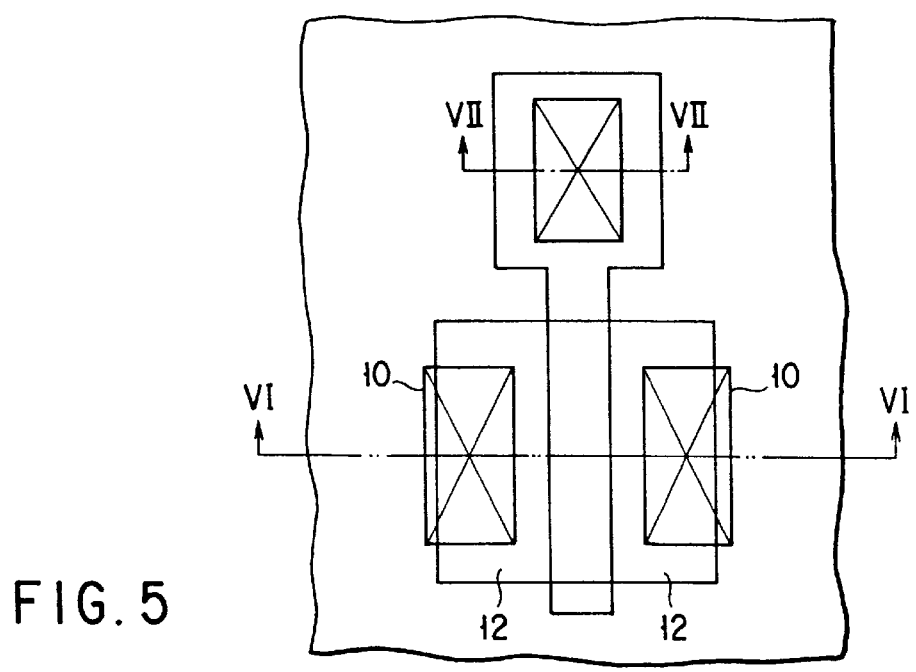
FIG. 5 is a diagram showing the plane of the structure of the semiconductor apparatus in a process of the method of manufacturing the semiconductor apparatus shown in FIGS. 1A and 1B.
Figure 6:
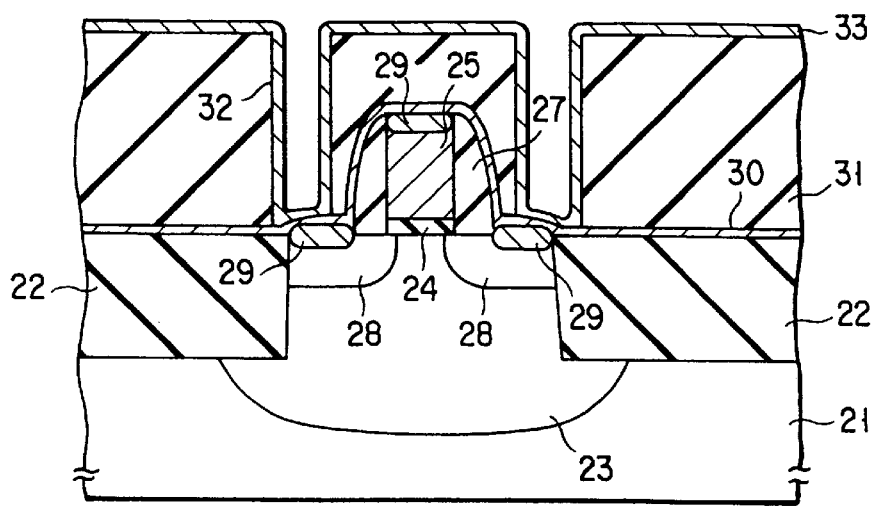
FIG. 6 is a diagram showing the cross section taken along line VI—VI of FIG. 5 and showing the structure of the semiconductor apparatus in a process of the method of manufacturing the semiconductor apparatus shown in FIGS. 1A and 1B.
Figure 7:
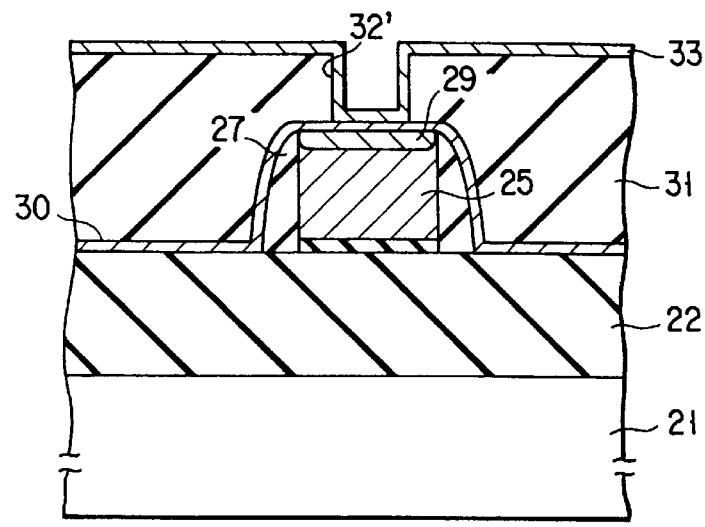
FIG. 7 is a diagram showing the cross section taken along line VII—VII of FIG. 5 and showing the structure of the semiconductor apparatus in a process of the method of manufacturing the semiconductor apparatus shown in FIGS. 1A and 1B.

Then, as shown in FIGS. 5 to 7, a plasma CVD method is employed to form the silicon insulating film 30 having a thickness of about 10 nm and having a nonstoichiometric composition on the overall surface of the silicon substrate 21. Then, the LPCVD method is employed to form the silicon oxide film (the interlayered insulating film) 31 having a thickness of about 900 nm on the insulating film 30.

Then, a CMP (Chemical Mechanical Polishing) method is employed to polish the interlayered insulating film 31 so that the surface of the interlayered insulating film 31 is flattened.

Then, the photolithography technique is employed to form the resist pattern (not shown) on the interlayered insulating film 31. Then, the RIE method is employed to etch the interlayered insulating film 31 in such a manner that the resist pattern is used as a mask. As a result, the contact hole 32 is formed above the source/drain diffusion layer 28 and the contact hole 32' is formed above the gate electrode 25.

Since the RIE process is performed on condition that the insulating film 30 and the interlayered insulating film 31 have a sufficiently large etching selection ratio to enable the insulating film 30 to serve as the stopper, the RIE process is performed in such a manner that the process of etching the interlayered insulating film 31 is stopped in the surface portion of the insulating film 30. Therefore, the height of each of the bottom surfaces of the contact holes 32 and 32' and that of the surface of the insulating film 30 are substantially the same.

Then, the barrier metal 33 having the laminate structure of titanium (Ti) and titanium nitride (TiN) having a thickness of about 10 nm is sequentially formed on the interlayered insulating film 31 and in the contact holes 32 and 32'.

Figure 8:
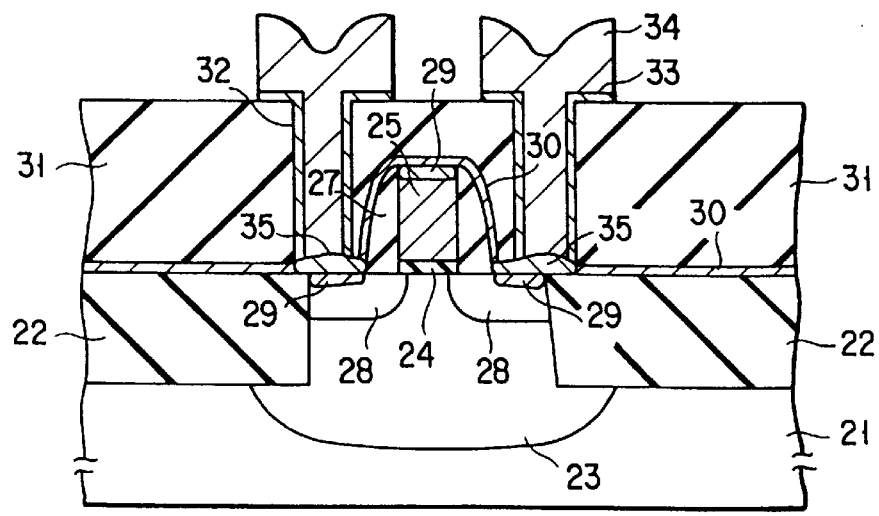
FIG. 8 is a diagram showing the cross section of the structure of the semiconductor apparatus in a process of the method of manufacturing the semiconductor apparatus shown in FIGS. 1A and 1B.
Figure 9:
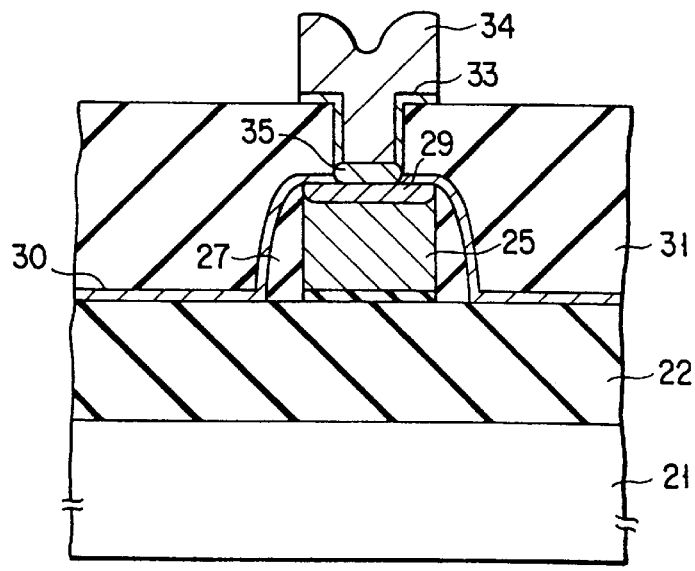
FIG. 9 is a diagram showing the cross section of the structure of the semiconductor apparatus in a process of the method of manufacturing the semiconductor apparatus shown in FIGS. 1A and 1B.

Then, as shown in FIGS. 8 and 9, annealing is performed at 400° C. to 600° C. so that portions of the insulating film 30 immediately below the contact holes 32 and 32' react with titanium in the titanium silicide layer 29 and that in the barrier metal (Ti/TiN) 33. Thus, the portions of the insulating film 30 are converted into the conductive film (Ti—Si—N alloy) 35. The titanium silicide layer 29 and the barrier metal 33 in the contact portions may completely disappear.

Then, for example, a sputtering method is employed to form a metal film (Al—Si—Cu alloy) having a thickness of about 400 nm on the barrier metal 33. Then, the usual lithography technique and etching technique are employed so that the metal layer 34 is formed.

The above-mentioned manufacturing method is arranged to form the insulating film 30 serving as the etching stopper on the source/drain diffusion layer 28 and the gate electrode 25. Therefore, undesirable etching of the device isolation film 22 and the silicon substrate (the source/drain diffusion layer) 21 during a process for forming the contact hole can be prevented.

Portions of the insulating film 30 immediately below the contact holes 32 and 32' react with metal atoms (for example, titanium) in the titanium silicide layer 29 and those (for example, titanium) in the barrier metal 33 by annealing. Thus, the above-mentioned portions are made to be conductive (alloyed). Therefore, the manufacturing process are not considerably increased. Thus, a semiconductor apparatus free from considerable leakage currents and having excellent reliability and low cost can be provided.

In this embodiment (the first embodiment), the silicon nitride film is employed as the etching stopper. As an alternative to the silicon nitride film, a compound may be employed which has a composition on the basis of SiN, such as a silicon nitride carbide film (SixNyCz, where x, y and z each are an arbitrary number).

The material of the titanium silicide layer 29 on the source/drain diffusion layer 28 is not limited to the titanium silicide. The titanium silicide layer 29 may be made of silicide, such as tungsten (W) or platinum (Pt). The titanium silicide layer 29 may be omitted under certain circumstance. Also the barrier metal 33 is not limited to titanium metal. The barrier metal 33 may be tungsten (W) or platinum (Pt).

In this embodiment (the first embodiment), the silicon nitride film 26 (see FIG. 3) on the gate electrode 25 is completely removed. The silicon nitride film 26 may be allowed to remain if a portion of the silicon nitride film 26 can be made to be conductive or removed.

In this embodiment (the first embodiment), the silicon nitride film 30 is caused to react with the silicide layer 29 and the barrier metal 33 so that the silicon nitride film 30 is alloyed. The silicon nitride film 30 may be caused to react with either of the silicide layer 29 or the barrier metal 33 so as to be alloyed. That is, either of the silicide layer 29 or the barrier metal 33 may be omitted.

In this embodiment, annealing is performed to alloy the silicon nitride film 30 before the metal layer (made of metal having a low melting point) 34 is formed. However, annealing may be performed after the metal layer 34 has been performed if the temperature condition is controlled.

Figure 10:
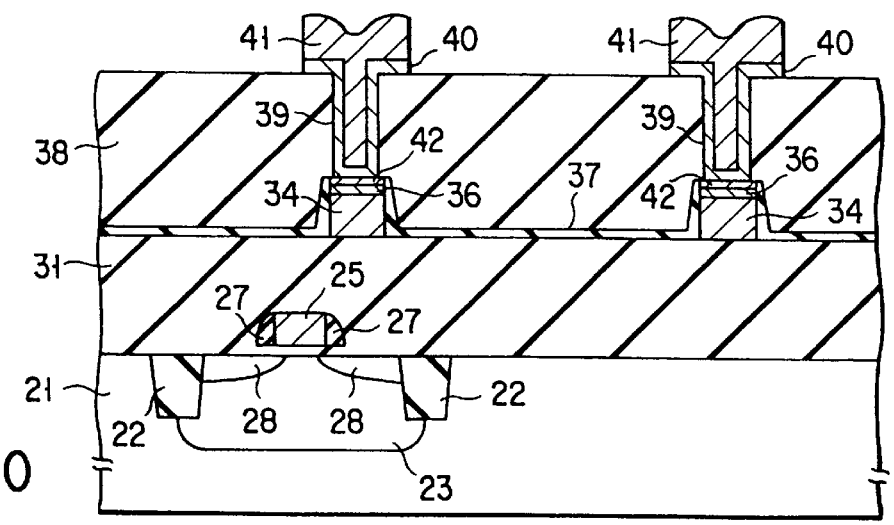
FIG. 10 is a diagram showing the cross section of a semiconductor apparatus according to a second embodiment of the present invention.

FIG. 10 shows a semiconductor apparatus according to a second embodiment of the present invention.

This embodiment relates to the structure of a via hole for establishing the connection between two wiring layers existing in individual layers.

A device insulating film 22 having, for example, the STI structure, is formed in the surface region of a silicon substrate 21. Therefore, the surface of the silicon substrate 21 and that of the device insulating film 22 substantially coincide with each other. As an alternative to the STI structure, the device insulating film 22 may have, for example, the LOCOS structure.

A portion of the silicon substrate 21 surrounded by the device insulating film 22 is in the form of a P-type well region 23. The depth of the well region 23 is larger than the depth (the thickness) of the device insulating film 22. If the silicon substrate 21 has the P-type structure, the well region 23 has an N-type structure.

A source/drain diffusion layer 28 is formed in the surface region of the well region 23. A gate electrode 25 is formed on a gate oxide film (for example, a silicon oxide film) on a channel region between the source/drain diffusion layer 28.

The gate electrode 25 is in the form of, for example, a polysilicon film containing impurities. A silicon nitride film 27 is formed on each of the side surfaces of the gate electrode 25 adjacent to the source/drain diffusion layer 28.

A silicon oxide film 31 for covering a MOS transistor composed of the gate electrode 25 and the source/drain diffusion layer 28 and having a thickness of about 900 nm is formed on the silicon substrate 21. The surface of the silicon oxide film 31 is flattened by a CMP method.

A metal layer in the form of a laminate of metal (for example, Al—Si—Cu alloy) 34 having a thickness of about 400 nmm and metal (for example, TiN) 36 having a thickness of about 40 nmm is formed on the silicon oxide film 31. That is, a wiring layer having an upper portion in the form of a metal layer containing metal having a high melting point is formed on the silicon oxide film 31.

An insulating film 37 which is an essential portion of the present invention is formed on the silicon oxide film 31 and the side surfaces of the metal layers 34 and 36. The insulating film 37 must have two characteristics below.

The insulating film 37 must have a sufficiently large etching selection ratio with respect to the interlayered insulating films 31 and 38. Moreover, the insulating film 37 must be enabled to react with metal, such as silicon or silicide, to be converted into a conductive film.

An insulating film having the two characteristics is exemplified by a silicon nitride film (SiN) if each of the interlayered insulating films 31 and 38 is made of silicon oxide film ($SiO_2$).

The silicon nitride film, having the insulating characteristic, is caused to react with metal, for example, titanium nitride (TiN) or titanium (Ti), or titanium silicide ($TiSi_2$) so as to be formed into TixSiyNz (where x, y and z each are an arbitrary number) having conductivity.

The interlayered insulating film 38 is formed on the insulating film 37. A via hole 39 which reaches the metal layer composed of the metal layers 34 and 36 is formed in the interlayered insulating film 38. The bottom surface of the via hole 39 is not lower than the surface of the silicon nitride film 37.

A barrier metal film 40 and a metal layer 41 are formed in the via hole 39. The barrier metal film 40 is made of, for example, titanium nitride or a laminate of titanium and titanium nitride. That is, a wiring layer having a lower portion in the form of a metal layer containing metal having a high melting point is formed in the contact hole 39. The metal layer 41 may be made of, for example, Al (aluminum)—Si (silicon)—Cu (copper).

A conductive film 42 is formed between the metal layer 36 and the barrier metal film 40. The conductive film 42 is a film formed as a result of a reaction of the insulating film 37 with the metal (titanium nitride) 36 and/or barrier metal film (titanium nitride) 40. Therefore, the composition of the conductive film 42 contains at least atoms for forming the insulating film 37, atoms for forming the metal 36 and/or atoms for forming the barrier metal film 40.

If the metal layer 36 is made of titanium nitride, the insulating film 37 is made of silicon nitride and the barrier metal film 40 is made of titanium nitride as described above, the conductive film 42 has a composition expressed by TixSiyNz.

The semiconductor apparatus having the above-mentioned multi-layered circuit structure has the silicon nitride film 37 serving as the etching stopper. The silicon nitride film 37 is formed on the silicon oxide film 31 serving as an underlayered layer for the lower wiring layer formed by the metal layers 34 and 36. Therefore, the via hole 39 for establishing the connection between different wiring layers is not introduced into the silicon oxide film 31. As a result, the manufacturing yield of the semiconductor apparatuses can be improved.

The conductive film 42 is formed between the lower circuit formed by the metal layers 34 and 36 and the upper circuit composed of the metal layers 40 and 41. Since the conductive film 42 is formed by making the insulating film 37 to be conductive, the manufacturing process is not increased. Thus, the manufacturing cost can be reduced.

A method of manufacturing the semiconductor apparatus according to the second embodiment of the present invention will now be described.

Figure 11:
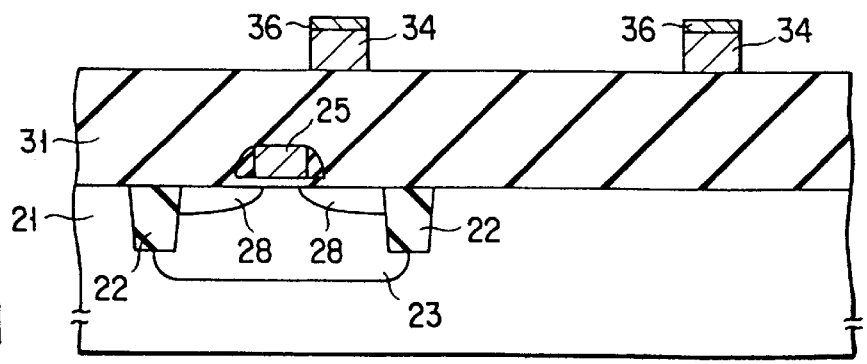
FIG. 11 is a diagram showing the cross section of the structure of the semiconductor apparatus in a process of the method of manufacturing the semiconductor apparatus shown in FIG. 10.

Initially, a method similar to the manufacturing method according to the first embodiment is employed so that a MOS transistor is formed on the silicon substrate 21, as shown in FIG. 11. Moreover, a silicon oxide film 31 having a thickness of about 900 nmm and arranged to cover the MOS transistor is formed on the silicon substrate 21.

The surface of the silicon oxide film 31 is flattened by a CMP method. A metal layer (Al—Si—Cu alloy) 34 having a thickness of about 400 nmm is formed on the silicon oxide film 31.

This embodiment is different from the first embodiment in that the metal (titanium nitride) 36 having a thickness of about 40 nmm is formed on the metal layer 34.

Figure 12:
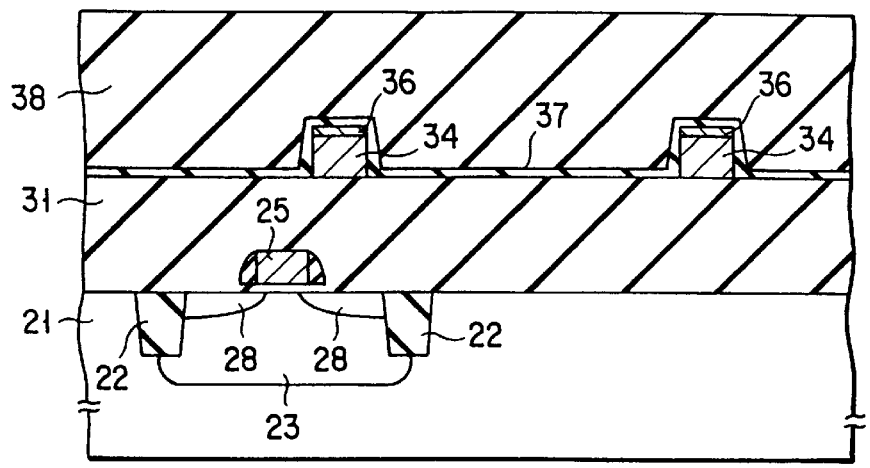
FIG. 12 is a diagram showing the cross-section of the structure of the semiconductor apparatus in a process of the method of manufacturing the semiconductor apparatus shown in FIG. 10.

Then, as shown in FIG. 12, a plasma CVD method is employed so that the insulating film 37 is formed which has a thickness of about 10 nm and a nonstoichiometric composition is formed on the silicon oxide film 31 and the metal layers 34 and 36.

Then, the LPCVD method is employed to form a interlayered insulating film (for example, a TEOS film) having a thickness of about 900 nmm on the silicon insulating film 37. The surface of the interlayered insulating film 38 is flattened by the CMP method.

Figure 13:
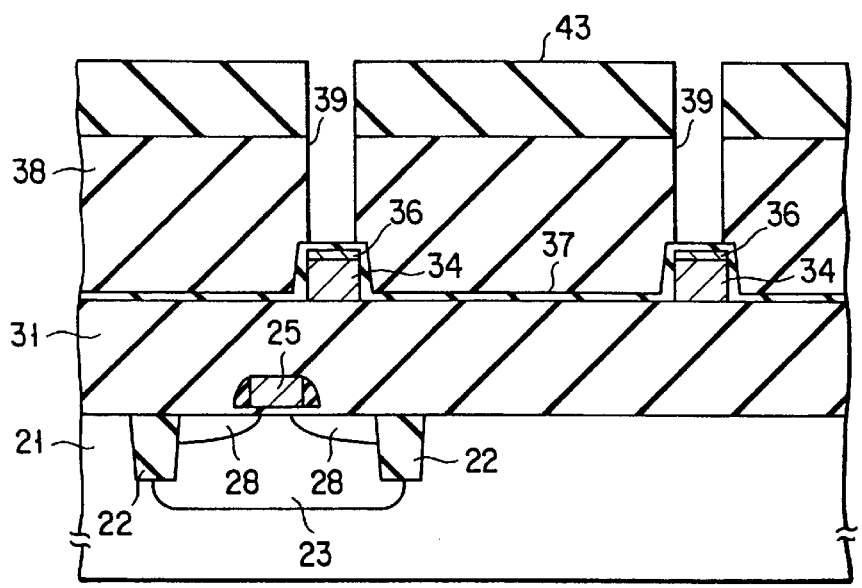
FIG. 13 is a diagram showing the cross section of the structure of the semiconductor apparatus in a process of the method of manufacturing the semiconductor apparatus shown in FIG. 10.

Then, resist is applied to the surface of the interlayered insulating film 38. Then, a usual lithography technique is employed so that a resist pattern 43 having openings on the metal layers 34 and 36 as shown in FIG. 13 is formed.

Then, the RIE method is employed to etch the interlayered insulating film 38 in such a manner that the resist pattern 43 is used as a mask. Thus, the via hole 39 is formed in the interlayered insulating film 38. At this time, the RIE process is performed in such a manner that an etching selection ratio of the silicon nitride film 37 and the interlayered insulating film (TEOS film) 38 is sufficiently high to enable the silicon nitride film 37 to serve as the stopper. Therefore, etching is stopped in the surface portion of the silicon nitride film 37.

Figure 14:
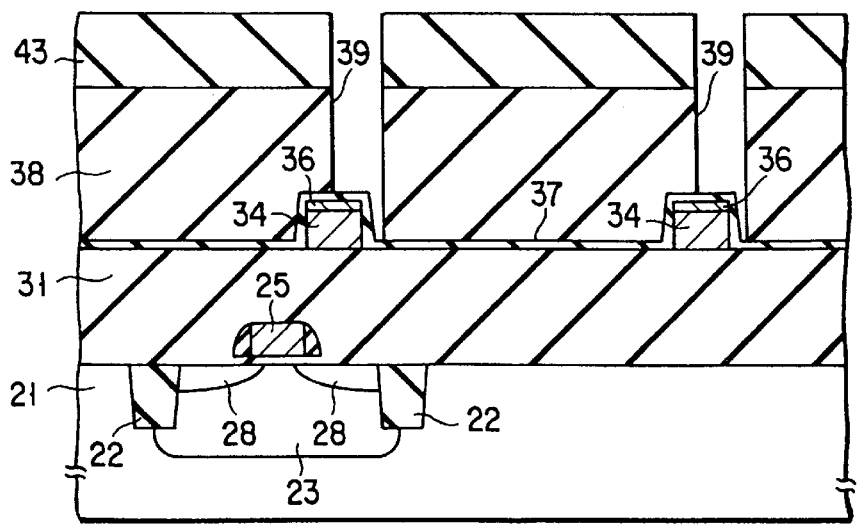
FIG. 14 is a diagram showing the cross section of the structure of the semiconductor apparatus in a process of the method of manufacturing the semiconductor apparatus shown in FIG. 10.

A state in which the position of the via hole 39 has been displaced because displacement in alignment between the reticle and the integrated circuit apparatus occurring the resist pattern 43 is formed as shown in FIG. 14 will now be described.

Also in this case, the silicon nitride film 37 covers the overall surface of the silicon oxide film 31. Therefore, etching is always stopped at the surface of the silicon nitride film 37. Thus, the bottom portion of the via hole 39 is not introduced into the silicon oxide film 31.

Figure 15:
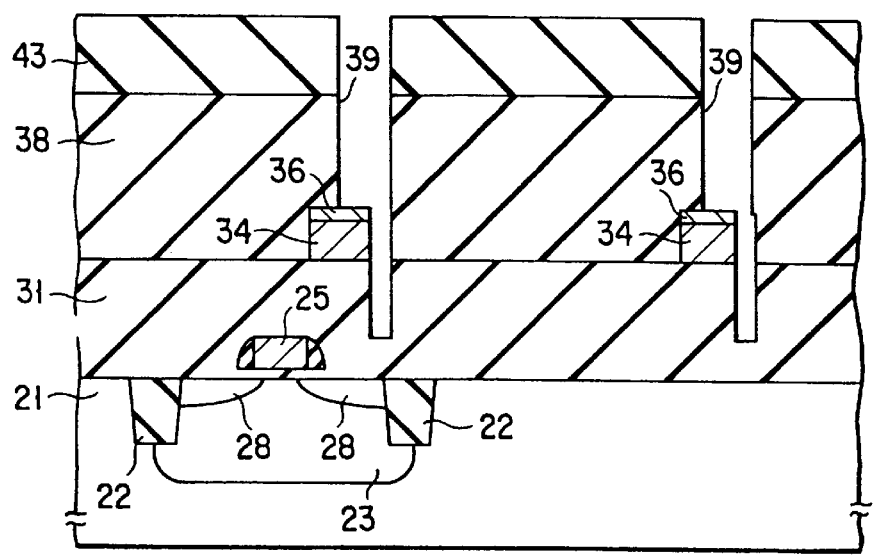
FIG. 15 is a diagram showing the cross section of the structure of the semiconductor apparatus in a process of the method of manufacturing a conventional semiconductor apparatus.

If the silicon nitride film serving as the etching stopper does not exist as shown in FIG. 15, etching proceeds to a position below the wiring layers 34 and 36, that is, into the silicon oxide film 31. As a result, the manufacturing yield deteriorates.

Figure 16:
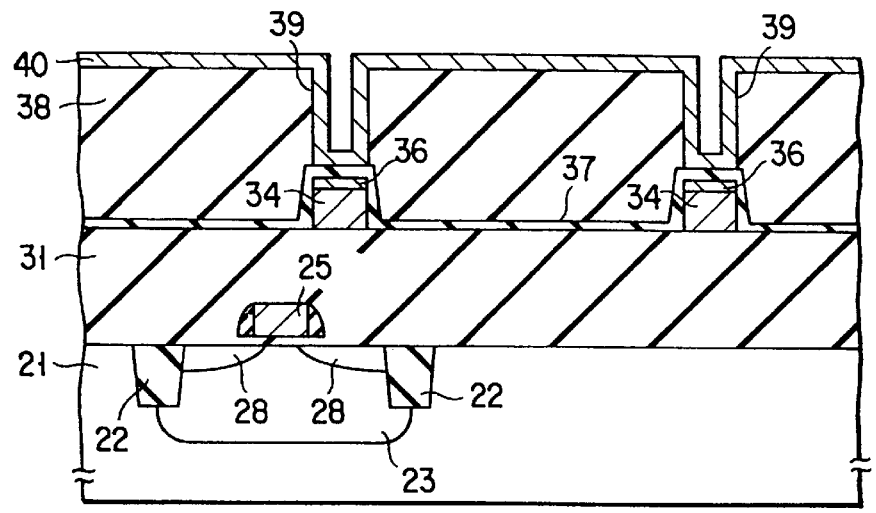
FIG. 16 is a diagram showing the cross section of the structure of the semiconductor apparatus in a process of the method of manufacturing the semiconductor apparatus shown in FIG. 10.

Then, description will now be performed about a state continued from a state shown in FIG. 13 in which no displacement in alignment takes place between the reticle and the integrated circuit apparatus and no displacement of the via hole 39 takes place. As shown in FIG. 16, a titanium (Ti) film having a thickness of about 3 nm and a titanium nitride (TiN) having a thickness of about 7 nm are continuously formed on the interlayered insulating film 38 and in the via hole 39. Thus, the barrier metal film 40 having a total thickness of about 10 nm is formed.

Figure 17:
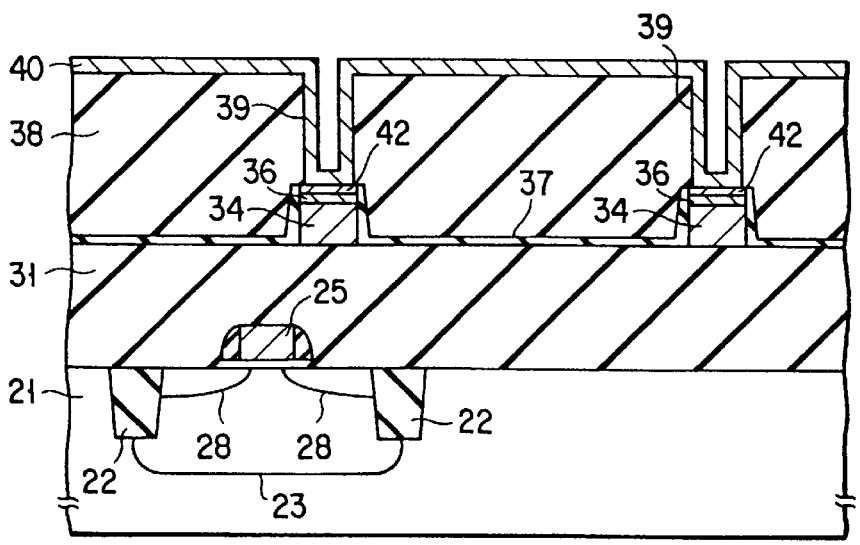
FIG. 17 is a diagram showing the cross section of the structure of the semiconductor apparatus in a process of the method of manufacturing the semiconductor apparatus shown in FIG. 10.

Then, annealing is performed at 400° C. so that a portion of the insulating film 37 immediately below the via hole 39 reacts with, for example, titanium in the titanium nitride 36 and titanium in the barrier metal (Ti/TiN) 40 so that the portion of the silicon nitride film 37 is converted into the conductive film (Ti—Si—N alloy) 42, as shown in FIG. 17.

Figure 18:
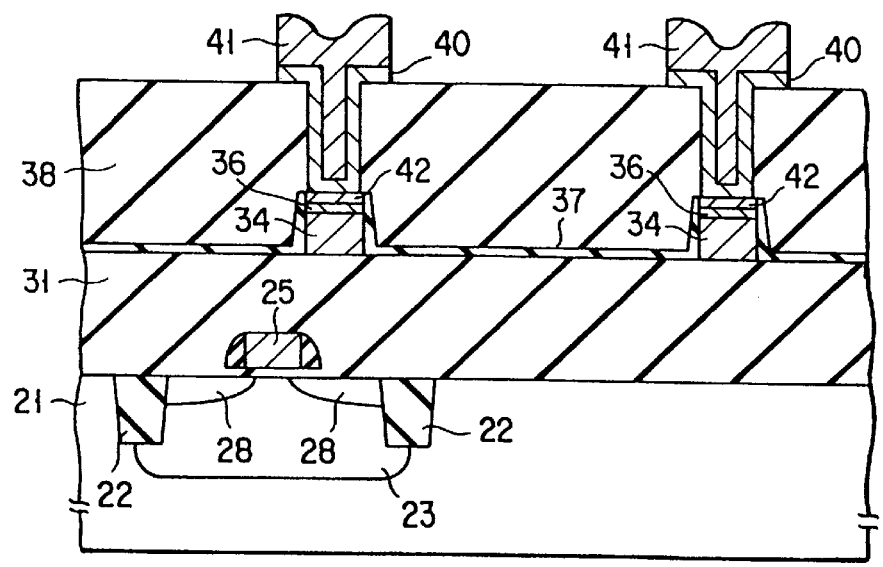
FIG. 18 is a diagram showing the cross section of the structure of the semiconductor apparatus in a process of the method of manufacturing the semiconductor apparatus shown in FIG. 10.
Figure 19:
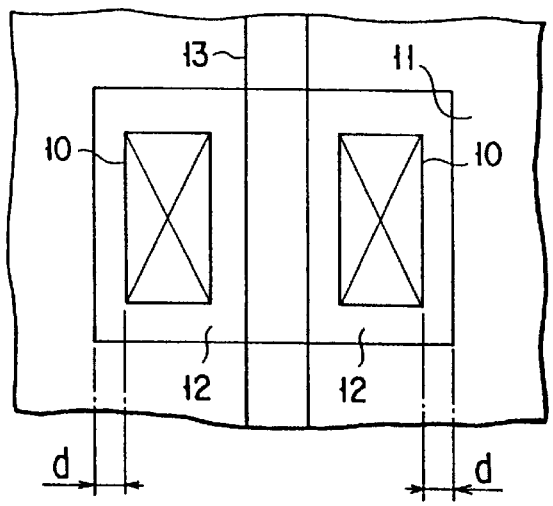
FIG. 19 is a diagram showing a planar pattern of the conventional semiconductor apparatus.
Figure 20:
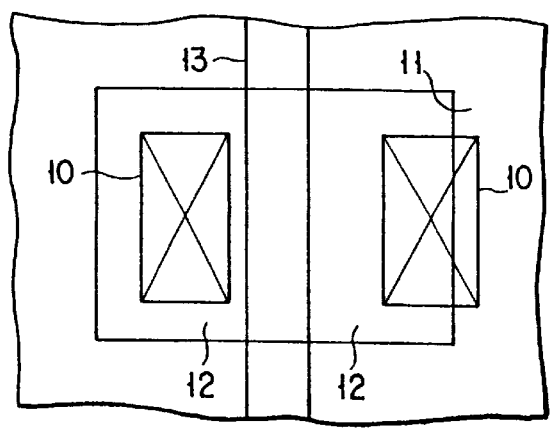
FIG. 20 is a diagram showing a planar pattern of the conventional semiconductor apparatus.
Figure 21:
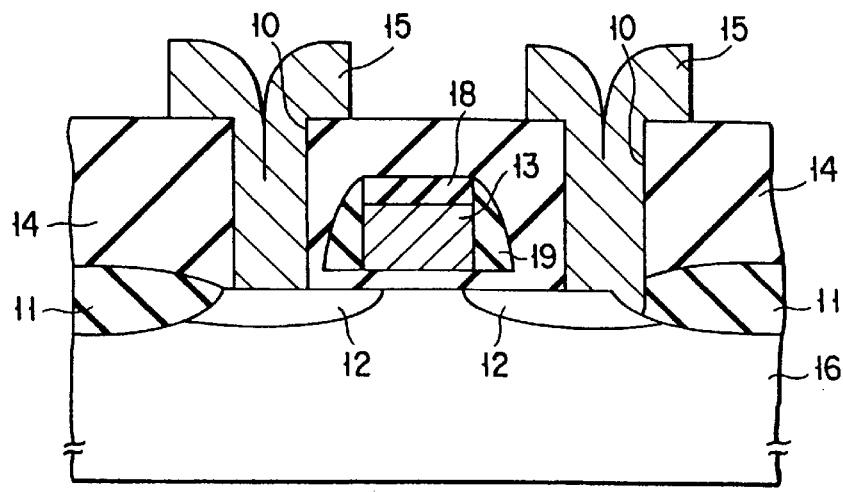
FIG. 21 is a diagram showing a planar pattern of the conventional semiconductor apparatus.
Figure 22:
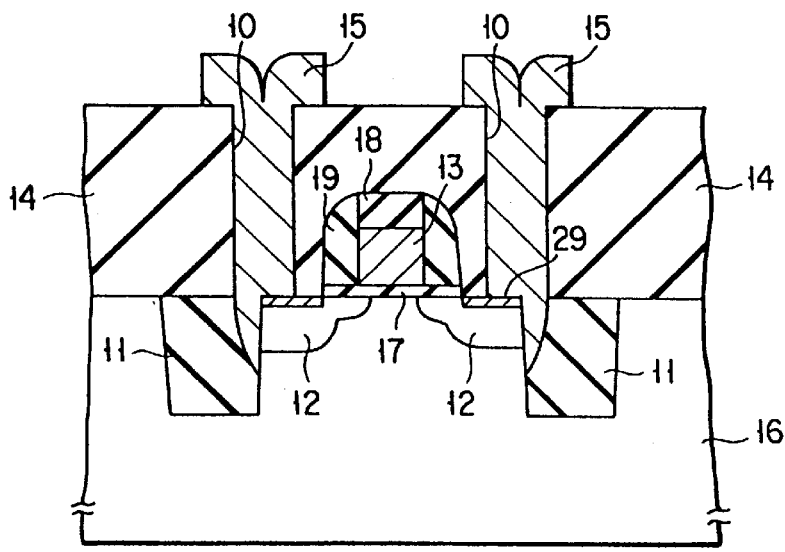
FIG. 22 is a diagram showing the cross section of a conventional semiconductor apparatus.
Figure 23:
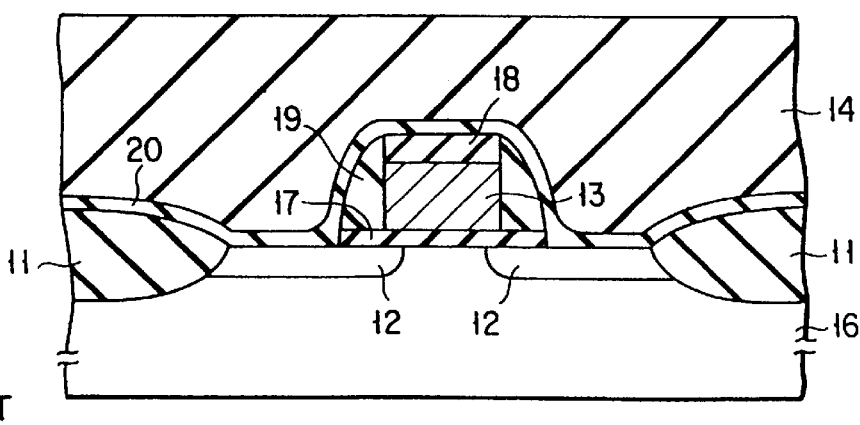
FIG. 23 is a diagram showing the cross section of the structure of the semiconductor apparatus in a process of the conventional method of manufacturing the semiconductor apparatus.
Figure 24:
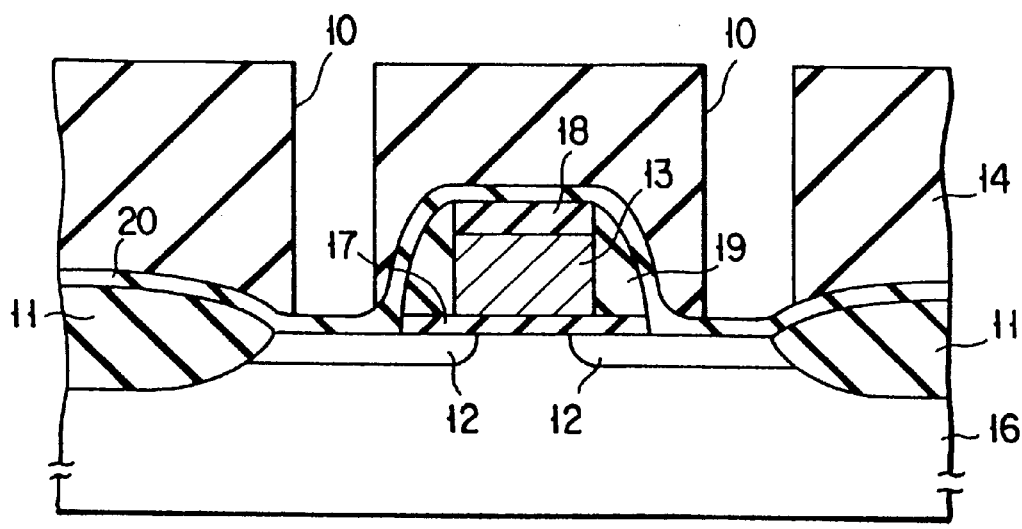
FIG. 24 is a diagram showing the cross section of the structure of the semiconductor apparatus in a process of the conventional method of manufacturing the semiconductor apparatus.
Figure 25:
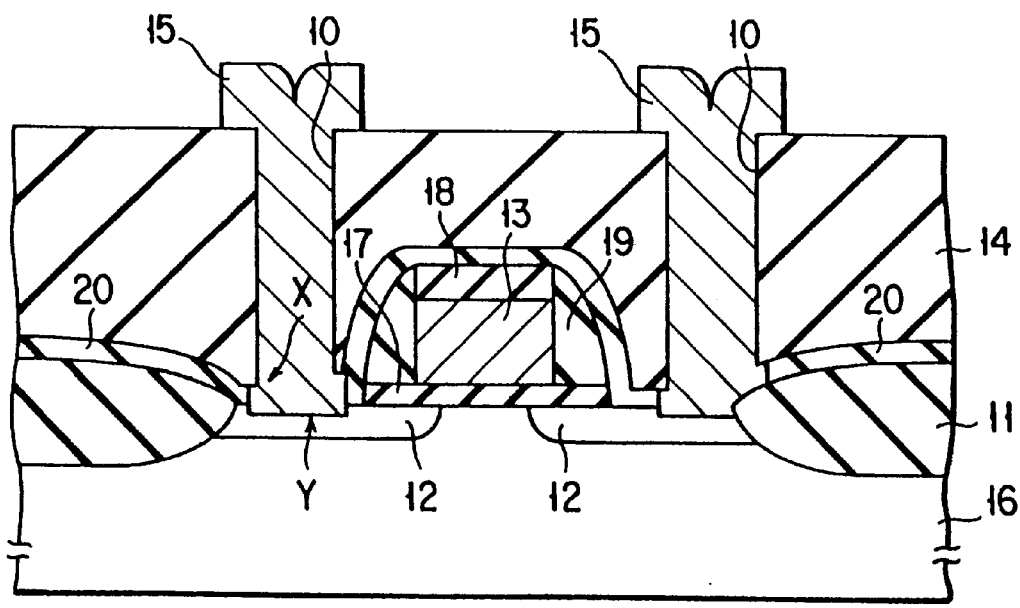
FIG. 25 is a diagram showing the cross section of the structure of the semiconductor apparatus in a process of the conventional method of manufacturing the semiconductor apparatus.

Then, for example, a sputtering method is employed so that a metal film (Al—Si—Cu alloy) having a thickness of about 600 nmm is formed on the barrier metal film 40. At this time, the usual lithography technique and etching technique are employed to pattern the metal film so that the metal layer 41 is formed, as shown in FIG. 18.

The above-mentioned manufacturing method is arranged in such a manner that the silicon nitride film 37 serving as the etching stopper is formed on the silicon oxide film 31 formed below the wiring layers 34 and 36. Therefore, even if the position of the via hole 39 is displaced because of the displacement in alignment of the reticles, etching is stopped on the surface of the silicon nitride film 37. That is, etching does not proceed into the silicon oxide film 31.

The portion of the insulating film 37 immediately below the via hole 39 reacts with metal atoms (for example, titanium) in the metal layer 36 and metal atoms (for example, titanium) in the barrier metal film 40 because of annealing so that the portion of the silicon nitride film 37 is made to be conductive (alloyed). Therefore, the manufacturing process is not considerably increased. As a result, a semiconductor apparatus free from considerable leakage currents and having excellent reliability and low cost can be provided.

Also the second embodiment has the structure that the silicon nitride film is employed to serve as the etching stopper. As an alternative to the silicon nitride film, a silicon nitride carbonate film (SixNyCz where x, y and z each are an arbitrary number) made of a compound based on SiN may be employed.

The material of the metal layer 36 and the barrier metal film 40 is not limited to the titanium nitride. The material may be metal, such as tungsten (W) or platinum (Pt).

In this embodiment, the silicon nitride film 37 is caused to react with both of the lower metal layer (titanium nitride) 36 and the upper metal layer (titanium nitride) 40 so that the silicon nitride film 37 is alloyed. The silicon nitride film 37 may be caused to react with either of the two metal layers so as to be alloyed. That is, either of the metal layers 36 and 40 may be omitted.

In this embodiment, annealing is performed for alloying the silicon nitride film 37 before the metal layer (the metal having a low melting point) 41 is formed. Annealing may be performed after the metal layer 41 has been formed if the temperature is controlled As described above, the semiconductor apparatus and manufacturing method according to the present invention attains the following effects.

The above-mentioned manufacturing method has the structure that the insulating film (the silicon nitride film and the like) serving as the etching stopper is formed on the source/drain diffusion layer, the gate electrode and the wiring layer. Therefore, etching is always stopped on the surface of the insulating film when the contact hole or the via hole is formed. Thus, etching of the device isolation film, the silicon substrate (the source/drain diffusion layer) and the interlayered insulating film below the wiring layer can be prevented.

The portion of the insulating film immediately below the contact hole or the via hole reacts with metal atoms (titanium and the like) in the metal silicide or the metal film or metal atoms (titanium and the like) in the barrier metal so that the portion of the insulating film is made to be conductive (alloyed). Therefore, the manufacturing cost is not enlarged excessively. Thus, a semiconductor apparatus free from considerable leakage current and exhibiting satisfactory reliability and low cost can be provided.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor apparatus comprising:
   a base layer;
   a first conductive layer formed on the base layer;
   an interlayered insulating film formed on the base layer, the interlayered insulating film covering the first conductive layer and having a contact hole opening toward the first conductive layer;
   an etch stop insulating film formed between the base layer and the interlayered insulating film, the etch stop insulating film covering the first conductive layer; and
   a second conductive layer formed in the contact hole formed in the interlayered insulating film; and
   an alloyed layer formed between the first conductive layer and the second conductive layer and having a composition containing an atom for forming the etch stop insulating film and a metal atom of at least one of the first conductive layer and the second conductive layer.

2. A semiconductor apparatus according to claim 1, in which the etch stop insulating film is made of a material having a sufficiently high selection ratio to serve as an etch stop for the interlayered insulating film and which produces an alloying reaction with a metal atom of at least one of the first conductive layer and the second conductive layer.

3. A semiconductor apparatus according to claim 1, in which the base layer is comprised of a semiconductor substrate, the first conductive layer is comprised of a silicide layer formed on a diffusion layer formed in a surface region of the semiconductor substrate, and the alloyed layer is formed between the silicide layer and the second conductive layer and has a composition containing an atom for forming the etch stop insulating film and a metal atom of the silicide layer.

4. A semiconductor apparatus according to claim 1, in which the base layer is comprised of a semiconductor substrate, the first conductive layer is comprised of a silicide layer formed on source/drain diffusion layers formed in a surface region of the semiconductor substrate and a silicide layer formed on a gate electrode above a channel region between the source/drain diffusion layers, and the alloyed layer is formed between the silicide layer and the second conductive layer and has a composition containing an atom for forming the etch stop insulating film and a metal atom of the silicide layer.

5. A semiconductor apparatus according to claim 1, in which the base layer is comprised of a semiconductor substrate, the first conductive layer is comprised of a diffusion layer formed in a surface region of the semiconductor substrate, a lower portion of the second conductive layer is formed of a metal layer including metal having a high melting point, and the alloyed layer is formed between the diffusion layer of the first conductive layer and the metal layer of the second conductive layer and has a composition containing an atom for forming the etch stop insulating film and a metal atom of the high melting point metal in the metal layer of the second conductive layer.

6. A semiconductor apparatus according to claim 1, in which the base layer is comprised of a semiconductor substrate, the first conductive layer is comprised of source/drain diffusion layers formed in a surface region of the semiconductor substrate and a gate electrode formed above a channel region between the source/drain diffusion layers, a lower portion of the second conductive layer is formed of a metal layer including metal having a high melting point, and the alloyed layer is formed between the source/drain diffusion layers and the metal layer of the second conductive layer and has a composition containing an atom for forming the etch stop insulating film and a metal atom of the high melting point metal in the metal layer of the second conductive layer.

7. A semiconductor apparatus according to claim 1, in which the base layer is comprised of a semiconductor substrate, the first conductive layer is comprised of a silicide layer formed on a diffusion layer formed in a surface region of the semiconductor substrate, a lower portion of the second conductive layer is formed of a metal layer including metal having a high melting point, and the alloyed layer is formed between the silicide layer of the first conductive layer and the metal layer of the second conductive layer and has a composition containing an atom for forming the etch stop insulating film, a metal atom of the silicide layer of the first conductive layer and a metal atom of the high melting point metal in the metal layer of the second conductive layer.

8. A semiconductor apparatus according to claim 1, in which the base layer is comprised of a semiconductor substrate, the first conductive layer is comprised of a silicide layer formed on source/drain diffusion layers formed in a surface region of the semiconductor substrate and a silicide layer formed on a gate electrode above a channel region between the source/drain diffusion layers, a lower portion of the second conductive layer is formed of a metal layer including metal having a high melting point, and the alloyed layer is formed between the silicide layer of the first conductive layer and the metal layer of the second conductive layer and has a composition containing an atom for forming the etch stop insulating film, a metal atom of the silicide layer of the first conductive layer and a metal atom of the high melting point metal in the metal layer of the second conductive layer.

9. A semiconductor apparatus according to claim 1, in which the base layer is comprised of an underlayered insulating film formed above a semiconductor substrate, the first conductive layer is formed on the underlayered insulating film, an upper portion of the first conductive layer is comprised of a metal layer containing metal having a high melting point, and the alloyed layer is formed between the metal layer of the first conductive layer and the second conductive layer and has a composition containing an atom for forming the etch stop insulating film and a metal atom of the high melting point metal in the metal layer of the first conductive layer.

10. A semiconductor apparatus according to claim 1, in which the base layer is comprised of an underlayered insulating film formed above a semiconductor substrate: the first conductive layer is formed on the underlayered insulating film, a lower portion of the second conductive layer is formed of a metal layer including metal having a high melting point, and the alloyed layer is formed between the first conductive layer and the metal layer of the second conductive layer and has a composition containing an atom for forming the etch stop insulating film and a metal atom of the high melting point metal in the metal layer of the second conductive layer.

11. A semiconductor apparatus according to claim 1, in which the base layer is comprised of an underlayered insulating film formed above a semiconductor substrate, the first conductive layer is formed on the underlayered insulating film, an upper portion of the first conductive layer is formed of a first metal layer including metal having a high melting point, a lower portion of the second conductive layer is formed of a second metal layer including metal having a high melting point, and the alloyed layer is formed between the first metal layer and the second metal layer and has a composition containing an atom for forming the etch stop insulating film, a metal atom of the high melting point metal in the first metal layer of the first conductive layer, and a metal atom of the high melting point metal in the second metal layer of the second conductive layer.

12. A method of manufacturing a semiconductor apparatus comprises the steps of:

forming a first conductive layer formed on a base layer;

forming an etch stop insulating film on the base layer, the etch stop insulating film covering the first conductive layer;

forming an interlayered insulating film on the etch stop insulating film, the interlayered insulating film covering the first conductive layer;

forming a contact hole in the interlayered insulating film, the contact hole opening toward the first conductive layer;

forming a second conductive layer in the contact hole formed in the interlayered insulating film; and performing annealing to react the etch stop insulating film with at least one of the first conductive layer and the second conductive layer so that the etch stop insulating film is alloyed with at least one of the first conductive layer and the second conductive layer.

13. A method of manufacturing a semiconductor apparatus according to claim 12, in which the first conductive layer forming step includes a step of forming a silicide layer, as the first conductive layer, on a diffusion layer formed in a surface region of a semiconductor substrate, and the annealing step includes an annealing step to react the etch stop insulating film with the silicide layer of the first conductive layer so that the etching stopper insulating film is alloyed with the silicide layer of the first conductive layer.

14. A method of manufacturing a semiconductor apparatus according to claim 12, in which the first conductive layer forming step includes a step of forming a silicide layer, as the first conductive layer, on source/drain diffusion layers formed in a surface region of a semiconductor substrate and a silicide layer on a gate electrode above a channel region between the source/drain diffusion layers, and the annealing step includes an annealing step to react the etch stop insulating film with the silicide layer so that the etch stop insulating film is alloyed with the silicide layer of the first conductive layer.

15. A method of manufacturing a semiconductor apparatus according to claim 12, in which the first conductive layer forming step includes a step of forming a diffusion layer, as the first conductive layer, in a surface region of a semiconductor substrate, the second conductive layer forming step includes a step of forming a metal layer, as the second conductive layer, containing metal having a high melting point in the contact hole formed in the interlayered insulating film, and the annealing step includes an annealing step to react the etch stop insulating film with the high melting point metal of the second conductive layer so that the etch stop insulating film is alloyed with the high melting point metal of the second conductive layer.

16. A method of manufacturing a semiconductor apparatus according to claim 12, in which the first conductive layer forming step includes a step of forming, source/drain diffusion layers, as the first conductive layer, in a surface region of a semiconductor substrate and a gate electrode above a channel region between the source/drain diffusion layers, the second conductive layer forming step includes a step of forming a metal layer, as the second conductive layer, containing metal having a high melting point in the contact hole formed in the interlayered insulating film, and the annealing step includes an annealing step to react the etch stop insulating film with the high melting point metal of the second conductive layer so that the etch stop insulating film is alloyed with the high melting point metal of the second conductive layer.

17. A method of manufacturing a semiconductor apparatus according to claim 12, in which the first conductive layer forming step includes a step of forming a silicide layer, as the first conductive layer, on a diffusion layer formed in a surface region of a semiconductor substrate, the second conductive layer forming step includes a step of forming a metal layer, as the second conductive layer, containing metal having a high melting point in the contact hole formed in the interlayered insulating film, and the annealing step includes an annealing step to react the etch stop insulating film with the silicide layer of the first conductive layer and the high melting point metal of the second conductive layer so that the etch stop insulating film is alloyed with the silicide layer of the first conductive layer and the high melting point metal of the second conductive layer.

18. A method of manufacturing a semiconductor apparatus according to claim 12, in which the first conductive layer forming step includes a step of forming a silicide layer, as the first conductive layer, on source/drain diffusion layers formed in a surface region of a semiconductor substrate and a silicide layer formed on a gate electrode above a channel region between the source/drain diffusion layers, the second conductive layer forming step includes a step of forming a metal layer, as the second conductive layer, containing metal having a high melting point in the contact hole formed in the interlayered insulating film, and the annealing step includes an annealing step to react the etch stop insulating film with the silicide layer and the high melting point metal of the second conductive layer so that the etch stop insulating film is alloyed with the silicide layer of the first conductive layer and the high melting point metal of the second conductive layer.

19. A method of manufacturing a semiconductor apparatus according to claim 12, in which the first conductive layer forming step includes a step of forming a metal layer containing metal having a high melting point, as the first conductive layer, on an underlayered insulating film formed above a semiconductor substrate, and the annealing step includes an annealing step to react the etch stop insulating film with the high melting point metal of the first conductive layer so that the etch stop insulating film is alloyed with the high melting point metal of the first conductive layer.

20. A method of manufacturing a semiconductor apparatus according to claim 12, in which the first conductive layer forming step includes a step of forming a first metal layer, as the first conductive layer, on an underlayered insulating film formed above a semiconductor substrate, the second conductive layer forming step includes a step of forming a second metal layer, as the second conductive layer, containing metal having a high melting point in the contact hole formed in the interlayered insulating film, and the annealing step includes an annealing step to react the etch stop insulating film with the high melting point metal of the second metal layer so that the etch stop insulating film is alloyed with the high melting point metal of the second metal layer.

21. A method of manufacturing a semiconductor apparatus according to claim 12, in which the first conductive layer forming step includes a step of forming a first metal layer containing metal having a high melting point, as the first conductive layer, on an underlayered insulating film formed above a semiconductor substrate, the second conductive layer forming step includes a step of forming a second metal layer, as the second conductive layer, containing metal having a high melting point in the contact hole formed in the interlayered insulating film, and the annealing step includes an annealing step to react the etch stop insulating film with the high melting point metal of the first metal layer and the high melting point metal of the second metal layer so that the etch stop insulating film is alloyed with the high melting point metal of the first metal layer and the high melting point metal of the second metal layer.

* * * * *